United States Patent [19]

Oka et al.

[11] Patent Number: 5,019,479
[45] Date of Patent: May 28, 1991

[54] POSITIVE TYPE RADIATION-SENSITIVE RESIN COMPOSITION COMPRISING A PHOTOSENSITIZER AND A NOVOLAK RESIN

[75] Inventors: Hiroshi Oka; Chozo Okuda; Yoshinori Yoshida; Toshihiko Takahashi, all of Yokkaichi; Yoichi Kamoshida, Yokohama; Takao Miura, Yokkaichi, all of Japan

[73] Assignee: Japan Synthetic Rubber Co., Ltd., Tokyo, Japan

[21] Appl. No.: 373,592

[22] Filed: Jun. 30, 1989

Related U.S. Application Data

[63] Continuation of Ser. No. 26,196, Mar. 16, 1987, abandoned.

[30] Foreign Application Priority Data

Mar. 28, 1986 [JP] Japan ................................. 61-70552
Jun. 23, 1986 [JP] Japan ................................. 61-146459

[51] Int. Cl.$^5$ .......................... G03C 1/60; G03C 1/54
[52] U.S. Cl. .............................. 430/172; 430/193/165
[58] Field of Search .................... 430/192, 193, 165

[56] References Cited

U.S. PATENT DOCUMENTS

| | | | |
|---|---|---|---|
| 3,666,473 | 5/1972 | Colom et al. | 96/91 |
| 4,173,470 | 11/1979 | Fahrenholtz et al. | 430/192 |
| 4,492,740 | 1/1985 | Yamamoto et al. | 430/193 |
| 4,650,741 | 3/1987 | Miura et al. | 430/192 |
| 4,719,167 | 1/1988 | Miura et al. | 430/326 |
| 4,859,563 | 8/1989 | Miura et al. | 430/192 |

FOREIGN PATENT DOCUMENTS

| | | | |
|---|---|---|---|
| 118291 | 9/1984 | European Pat. Off. | 430/192 |
| 144880 | 6/1985 | European Pat. Off. | 430/192 |
| 60-45238 | 3/1985 | Japan | 430/192 |

OTHER PUBLICATIONS

*Journal of Vacuum Science & Technology*, (1986), vol. 4, pp. 430-436, "High Performance Positive Photoresists", A. Furuta et al.

Derwent Abstract of West Germany Patent #3,521,555, published 1/9/86 (Konishiroku Photo).

Derwent Abstract of Great Britain Patent 2,172,117, published 9/10/86 (Konishiroku Photo).

Pampalone, T. R., *Solid State Technology*, 6/1984, pp. 115-120.

English Abstract of Japanese Publication #61-118,744 published 6/6/86 (Tokyo Oka Kogyo KK).

English Abstract of Japanese Publication #60-176,034 published 9/10/85 (Japan Synthetic Rubber).

*Primary Examiner*—Charles L. Bowers, Jr.
*Assistant Examiner*—Patrick A. Doody
*Attorney, Agent, or Firm*—Oblon, Spivak, McClelland, Maier & Neustadt

[57] ABSTRACT

A positive type radiation-sensitive resin composition comprising an alkali-soluble novolac resin and a 1,2-quinonediazide compound, characterized in that said alkali-soluble novolac resin is a resin produced by condensing a carbonyl compound and a phenol mixture comprising 6 to 94 mole % of m-cresol and 94 to 6 mole % of at least one compound represented by the formula (I) other than m-cresol:

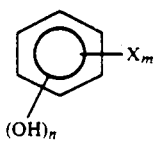

(I)

wherein X is $-CH_3$, $-C_2H_5$, $-C(CH_3)_3$, $-CO_2CH_3$ or $-CO_2C_2H_5$; n is an integer satisfying $3 \geq m \geq 1$; and m is an integer satisfying $3 \geq m \geq 1$, in which resin when the polystyrene-reduced molecular weight is determined by a gel permeation chromatography using a monodisperse polystyrene as the standard, maximum values a, b and c present, respectively, in the molecular weight ranges of 6,300 to 25,000, 2,500 to 6,000 and 150 to 900 in the molecular weight distribution curve obtained satisfy the following relationships: a/b=0−1.5 and c/b=1.4−2. Said positive type-radiation-sensitive resin composition is excellent in resolution, sensitivity, developability, thermal resistance and adhesion and hence is useful as a positive type resist for producing integrated circuits having a higher integration.

12 Claims, No Drawings

POSITIVE TYPE RADIATION-SENSITIVE RESIN COMPOSITION COMPRISING A PHOTOSENSITIZER AND A NOVOLAK RESIN

This application is a continuation of application Ser. No. 07/026,196, filed on Mar. 16, 1987, now abandoned.

This invention relates to a positive type radiation-sensitive resin composition. More particularly, this invention relates to a positive type radiation-sensitive resin composition comprising a specific alkali-soluble novolac resin and a 1,2-quinonediazide compound, which composition is sensitive to radiations such as ultraviolet rays, far-ultraviolet rays, X-rays, electron beams, molecular beams, gamma-rays, synchrotron radiations, proton beams and the like and is particularly suitable as a resist for producing integrated circuits.

The resists which have heretofore been used in the production of integrated circuits include negative type resists comprising a cyclized rubber and a bisazide compound, and positive type resists comprising an alkali-soluble resin and a 1,2-quinonediazide compound. When the negative type resist is irradiated with ultra violet rays, the bisazide compound liberates its nitrogen atom to become a nitrene, which three-dimensionally crosslinks the cyclized rubber. As a result, the ultraviolet-irradiated portions and the ultraviolet-unirradiated portions of the cyclized rubber have different solubilities in a developing solution consisting of a solvent, whereby patterning is made possible. However, the ultraviolet-irradiated portions are not completely cured, and therefore, the resist pattern is greatly swollen in the developing solution, whereby the resolution of the resist pattern becomes low.

On the other hand, the positive type resist comprises an alkali-soluble resin and an alkali-insoluble 1,2-quinonediazide compound, and hence, is difficult to dissolve in a developing solution consisting of an aqueous alkaline solution and is hardly swollen. That is, the 1,2-quinonediazide compound contained in the ultraviolet-irradiated portions is converted into an indenecarboxylic acid and, in development stage, is developed with a developing solution consisting of an aqueous alkaline solution. Meanwhile, the ultraviolet-unirradiated portions which are to form a resist pattern cause little change in the development, and therefore, a resist pattern is obtained which is faithful to the pattern of mask used and has a high resolution. Thus, in recent years during which higher integration of integrated circuits has been required, such positive type resists having an excellent resolution have often been used.

However, even with the positive type resists, in order to obtain a resist pattern faithful to the pattern of mask used, it is necessary that the ultraviolet-irradiated portions of resist be quickly developed till their part contacting the wafer. At the present time when the integration is high and the resist pattern distance (hereinafter referred to as a line width) is as narrow as 1 μm or less, the developability of the foot part of the resist pattern greatly affects the resolution.

In the production of integrated circuits, a step-and-repeat reduction system is adopted in order to achieve a resolution of 1 μm or less, and this system has a problem that the throughput becomes low, that is, the exposure time per sheet of wafer becomes long. For solving the problem, it is necessary to make the resist highly sensitive.

With increasing the integration of integrated circuits, the width of wiring is becoming finer, and to realize this, dry etching is employed in some cases. While it is desirable that no change of resist pattern be caused during the dry etching, conventional positive type resist have such a problem that the thermal resistance is insufficient and deformation of resist pattern is caused during the dry etching.

Further, conventional positive type resists have a problem of insufficient adhesion to a substrate. This insufficient adhesion problem causes an etchant to penetrate between the substrate and the resist, whereby undesirable etching of the substrate in the horizontal direction is increased.

Thus, the performance required for resists includes resolution, sensitivity, developability, thermal resistance and adhesion. Of these, sensitivity and thermal resistance have a tendency to contradict each other. That is, in conventional positive type resists, the decrease of the molecular weight of the novolac resin used therein results in an increase of the sensitivity of resist while its thermal resistance deteriorates. Further, the decrease of the molecular weight of the novolac resin tends to bring about an improvement of the developability and resolution of resist while its thermal resistance deteriorates as well.

Thus, the improvement of the required performance in one respect results in a deterioration in other respects, and therefore, conventional positive type resists are not satisfactory in respect of performance.

An object of this invention is to provide a positive type radiation-sensitive resin composition which has solved the above-mentioned problems of the prior art, has excellent resolution, sensitivity, developability, thermal resistance and adhesion, and is suitable as a positive type resist for producing integrated circuits having a high integration.

Other objects and advantages of this invention will become apparent from the following description.

According to this invention, there is provided a positive type radiation-sensitive resin composition comprising an alkali-soluble novolac resin (hereinafter referred to simply as novolac) and a 1,2-quinonediazide compound, characterized in that the novolac is a resin produced by condensing a carbonyl compound and a phenol mixture comprising 6 to 94 mole % of m-cresol and 94 to 6 mole % of a compound (other than m-cresol) represented by the formula (I):

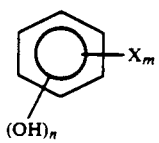

wherein X is $-CH_3$, $-C_2H_5$, $-C(CH_3)_3$, $-CO_2CH_3$ or $-CO_2C_2H_5$; n is an integer satisfying $3 \geq n \geq 1$; and m is an integer satisfying $3 \geq m \geq 1$, in which resin when the polystyrenereduced molecular weight is determined by a gel permeation chromatography (GPC) using a monodisperse polystyrene as the standard, maximum values a, b and c present, respectively, in the molecular weight ranges of 6,300 to 25,000, 2,500 to 6,000 and 150 to 900 in the molecular weight distribution curve obtained satisfy the following relationships:

$a/b = 0 - 1.5$ $c/b = 0.4 - 2$

The novolac used in the present resin composition is a resin obtained by condensing a carbonyl compound and a phenol mixture comprising 6 to 94 mole % of m-cresol and 94 to 6 mole % of a compound of the formula (I).

The compound of the formula (I) used in this invention includes, for example, o-cresol, p-cresol, 3,5-dimethylphenol, 2,5-dimethylphenol, 2,3-dimethylphenol, 2,4-dimethylphenol, 2,6-dimethylphenol, 3,4-dimethylphenol, 2,3,5-trimethylphenol, 4-t-butylphenol, 2-t-butylphenol, 3-t-butylphenol, 2-methylresorcinol, 4-methylresorcinol, 5-methylresorcinol, 4-t-butylcatechol, 4-methoxyphenol, 3 methoxyphenol, 2-methoxyphenol, 2-methoxycatechol, 2-methoxyresorcinol, 3-methoxyresorcinol, 2,3-dimethoxyphenol, 2,5-dimethoxyphenol, 3,5-dimethoxyphenol, methyl gallate, ethyl gallate, methyl 3-methoxy-4,5-dihydroxybenzoate, ethyl 3-methoxy-4,5-dihydroxybenzoate, methyl 4-methoxy-3,5-dihydroxybenzoate, ethyl 4-methoxy 3,5-dihydroxybenzoate, methyl 3,4-dimethoxy5-hydroxybenzoate, ethyl 3,4-dimethoxy-5-hydroxybenzoate, methyl 3,5-dimethoxy-4-hydroxybenzoate, ethyl 3,5-dimethoxy-4-hydroxybenzoate, 3-ethylphenol, 2-ethylphenol, 4-ethylphenol, 2,3,5-triethylphenol, 3,5-diethylphenol, 2,5-diethylphenol, 2,3-diethylphenol and the like. These compounds are used alone or in admixture of two or more.

The molar ratio of m-cresol to the compound of the formula (I) in the phenol mixture is 6 - 94/94 6, preferably 30 - 90/70 - 10, more preferably 40 - 80/60 - 20.

When the molar ratio of m-cresol to the compound of the formula (I) is less than 6/94 or more than 94/6, the present resin composition becomes unsatisfactory in sensitivity, resolution and developability.

When the compound of the formula (I) is p-cresol, the molar ratio of m-cresol to p-cresol is preferably 30 - 70/70 - 30, more preferably 40 - 60/60 - 40.

When the proportion of m-cresol used exceeds 70 mole %, the present resin composition becomes slightly inferior in resolution and developability. Incidentally, the ratio and proportion are those of raw materials used in the production of novolac.

The novolac used in this invention is a resin wherein when the polystyrene-reduced molecular weight is determined by GPC using a monodisperse polystyrene as the standard and employing columns manufactured by TOYO SODA MFG. CO., LTD. (two G 2,000 H6 columns, one G 3,000 H6 column and one G 4,000 H6 column) under the conditions that the flow rate is 1.5 ml/min, the elution solvent is tetrahydrofuran and the column temperature is 40° C., maximum values a, b and c present, respectively, in the molecular weight ranges of 6,300 to 25,000, 2,500 to 6,000 and 150-900 in the molecular weight distribution curve obtained satisfy the following relationships:

$a/b = 0 - 1.5$ and $c/b = 0.4 - 2$, preferably $a/b = 0.2 - 1.3$ and $c/b = 0.5 - 1.5$, more preferably $a/b = 0.4 - 1.3$ and $c/b = 0.5 - 1.3$.

Ehen the novolac is produced by condensing m-cresol and p-cresol with a carbonyl compound, preferably $a/b = 0.4 - 1.5$ and $c/b = 0.4 - 2$.

When using such a novolac, a resin composition obtained is superior to those obtained using conventional novolacs in respect of resolution, sensitivity, developability, thermal resistance and adhesion.

When the a/b value exceeds 1.5, the resulting composition becomes inferior in developability and sensitivity. When the c/b value exceeds 2, the composition becomes inferior in thermal resistance. When the c/b value is less than 0.4, the composition becomes unsatisfactory in sensitivity and resolution.

The novolac used in this invention can be produced by condensing m-cresol and a compound represented by the formula (I) (these two compounds are hereinafter referred to as the phenol mixture) with a carbonyl compound in the presence of an acid catalyst. However, the novolac can also be produced in the absence of the catalyst.

The carbonyl compound includes, for example, compounds represented by the formula (II):

wherein $R^1$ and $R^2$, which may be the same or different, represent hydrogen atoms, alkyl groups, aryl groups, alkenyl groups or aralkyl groups.

In the definitions of $R^1$ and $R^2$ in the formula (II), the alkyl groups include, for example, methyl, ethyl, propyl, butyl and the like; the aryl groups include, for example, phenyl, tolyl, cumenyl and the like; the alkenyl groups include, for example, vinyl, propenyl, allyl, butenyl and the like; and the aralkyl groups include, for example, benzyl, phenethyl, phenylpropyl and the like.

The carbonyl compound includes, for example, formaldehyde, paraformaldehyde, acetaldehyde, propylaldehyde, benzaldehyde, phenylacetaldehyde, alphaphenylpropylaldehyde, beta-phenylpropylaldehyde, tolylbenzaldehyde, mesitylbenzaldehyde, phenethylbenzaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, acrolein, crotonaldehyde, cinnamaldehyde, acetone, methyl ethyl ketone, diethyl ketone, methyl isobutyl ketone, methyl phenyl ketone, methyl benzyl ketone and the like. Of these, preferred are formaldehyde, acetaldehyde, benzaldehyde, p-hydroxybenzaldehyde, acrolein, acetone, methyl ethyl ketone, diethyl ketone, methyl isobutyl ketone, methyl phenyl ketone, methyl benzyl ketone and the like. These carbonyl compounds can be used alone or in admixture of two or more.

The carbonyl compound is used in an amount of preferably 0.7 to 3 moles, more preferably 0.7 to 2 moles, per mole of the phenol mixture.

As the acid catalyst, there are used, for example, an inorganic acid (e.g. hydrochloric acid, nitric acid, sulfuric acid or the like) and an organic acid (e.g. formic acid, acetic acid, oxalic acid or the like). The acid catalyst is used in an amount of preferably $1 \times 10^{-1}$ mole or less, more preferably $1 \times 10^{-4}$ to $5 \times 10^{-1}$ mole, per mole of the phenol mixture.

Water is ordinarily used as a reaction medium in the condensation reaction. A hydrophilic solvent may also be used as the reaction medium. The hydrophilic solvent includes, for example, an alcohol (e.g. methanol, ethanol, propanol, butanol or the like) and a cyclic ether (e.g. tetrahydrofuran, dioxane or the like).

The reaction medium is used in an amount of preferably 20 to 1,000 parts by weight per 100 parts by weight in total of the phenol mixture and the carbonyl compound.

The temperature of the condensation reaction may be appropriately varied depending upon the reactivity of the phenol mixture and the carbonyl compound though it is usually 10° to 200° C., preferably 70° to 130° C. The process for producing the novolac may be either of a process wherein the phenol mixture, the carbonyl compound and the acid catalyst are charged together at one time to effect the reaction, a process wherein the phenol mixture is stepwise added to the carbonyl compound and the acid catalyst with the progress of reaction, and other processes. In the process wherein the phenol mixture is stepwise added, the novolac can be stably produced in good reproducibility. Therefore, it is preferred that a part of the phenol mixture, the carbonyl compound and the acid catalyst be initially charged to start a condensation reaction and the rest of the phenol mixture be added with the progress of the reaction to continue the reaction. After the completion of the reaction, in order to remove the unreacted starting materials, the acid catalyst and the reaction medium, generally the internal temperature is elevated to 130° to 230° C. and volatile matters are removed by distillation under reduced pressure. Then, the molten novolac is poured on a steel belt or the like to recover the novolac. The novolac can also be recovered by adding a solvent to the molten novolac.

The 1,2-quinonediazide compound used in this invention is not critical and includes, for example, 1,2-benzoquinonediazide-4-sulfonic acid esters, 1,2-naphthoquinonediazide-4-sulfonic acid esters, 1,2-naphthoquinonediazide-5-sulfonic acid esters and the like. Specifically the following may be used: 1,2-quinonediazidesulfonic acid esters of (poly)hydroxybenzenes such as p-cresol-1,2-benzoquinonediazide-4-sulfonic acid ester, resorcinol-1,2-naphthoquinonediazide-4-sulfonic acid ester, pyrogallol-1,2-naphthoquinonediazide-5-sulfonic acid ester and the like; 1,2-quinonediazidesulfonic acid esters of (poly)hydroxyphenyl alkyl ketones or (poly)hydroxyphenyl aryl ketones such as 2,4-dihydroxyphenyl propyl ketone-1,2-benzoquinonediazide-4-sulfonic acid ester, 2,4-dihydroxyphenyl-n-hexyl ketone-1,2-naphthoquinonediazide-4-sulfonic acid ester, 2,4-dihydroxybenzophenone-1,2-naphthoquinonediazide-5-sulfonic acid ester, 2,3,4-trihydroxyphenone-n-hexyl ketone-1,2-naphthoquinonediazide-4-sulfonic acid ester, 2,3,4-trihydroxybenzophenone-1,2-naphthoquinonediazide-4-sulfonic acid ester, 2,3,4-trihydroxybenzophenone-1,2-naphthoquinonediazide-5-sulfonic acid ester, 2,4,6-trihydroxybenzophenone-1,2-naphthoquinonediazide-4-sulfonic acid ester, 2,4,6-trihydroxybenzophenone-1,2-naphthoquinonediazide-5-sulfonic acid ester, 2,2',4,4'-tetrahydroxybenzophenone-1,2-naphthoquinonediazide-5-sulfonic acid ester, 2,3,4,4'-tetrahydroxybenzophenone-1,2-benzoquinonediazide-4-sulfonic acid ester, 2,3,4,4'-tetrahydroxybenzophenone-1,2-naphthoquinonediazide-5-sulfonic acid ester, 2,2',4,4'-tetrahydroxybenzophenone-1,2-naphthoquinonediazide-4-sulfonic acid ester, 2,3,4,4'-tetrahydroxybenzophenone-1,2-naphthoquinonediazide-4-sulfonic acid ester, 2,2',3,4,6'-pentahydroxybenzophenone-1,2-naphthoquinonediazide-4-sulfonic acid 2,2',3,4,6'-pentahydroxybenzophenone-1,2-naphthoquinonediazide-5-sulfonic acid ester, 2,3,3',4,4',5'-hexahydroxybenzophenone-1,2-naphthoquinonediazide-4-sulfonic acid ester, 2,3,3',4,4',5'-hexahydroxybenzophenone- 1,2-naphthoquinonediazide-5-sulfonic acid ester, 2,3',4,4',5',6-hexahydroxybenzophenone-1,2-naphthoquinonediazide-4-sulfonic acid ester, 2,3',4,4',5',6-hexahydroxybenzophenone-1,2-naphthoquinonediazide-5-sulfonic acid ester and the like; 1,2-quinonediazidesulfonic acid esters of bis[(poly)-hydroxyphenyl]alkanes such as bis(p-hydroxyphenyl)methane-1,2-naphthoquinonediazide-4-sulfonic acid ester, bis(2,4-dihydroxyphenyl)methane-1,2-naphthoquinonediazide-5-sulfonic acid ester, bis(2,3,4-trihydroxyphenyl)methane-1,2-naphthoquinonediazide-5-sulfonic acid ester, 2,2-bis(p-hydroxyphenyl)propane-1,2-naphthoquinonediazide-4-sulfonic acid ester, 2,2bis(2,4-dihydroxyphenyl)propane-1,2-naphthoquinonediazide-5-sulfonic acid ester, 2,2-bis(2,3,4-trihydroxyphenyl)-propane-1,2-naphthoquinonediazide-5-sulfonic acid ester and the like; 1,2-quinonediazidesulfonic acid esters of alkyl (poly)hydroxybenzoates or aryl (poly)hydroxybenzoates such as lauryl 3,5-dihydroxybenzoate-1,2-naphthoquinonediazide-4-sulfonic acid ester, phenyl 2,3,4-trihydroxybenzoate-1,2 naphthoquinonediazide-5-sulfonic acid ester, propyl 3,4,5-trihydroxybenzoate-1,2-naphthoquinonediazide-5-sulfonic acid ester, phenyl 3,4,5-trihydroxybenzoate-1,2-naphthoquinonediazide-5-sulfonic acid ester and the like; 1,2-quinonediazidesulfonic acid esters of bis[(poly)-hydroxybenzoyl]alkanes or bis[(poly)hydroxybenzoyl]-benzenes such as bis(2,5-dihydroxybenzoyl)methane-1,2-naphthoquinonediazide-4-sulfonic acid ester, bis(2,3,4-trihydroxybenzoyl)methane-1,2-naphthoquinonediazide- 5-sulfonic acid ester, bis(2,4,6-trihydroxybenzoyl)methane-1,2-naphthoquinonediazide-5-sulfonic acid ester, p-bis(2,5-dihydroxybenzoyl)benzene-1,2-naphthoquinonediazide-4-sulfonic acid ester, p-bis(2,3,4-trihydroxybenzoyl)benzene-1,2-naphthoquinonediazide-5-sulfonic acid ester, p-bis(2,4,6-trihydroxybenzoyl)benzene-1,2-naphthoquinonediazide-5-sulfonic acid ester and the like; 1,2-quinonediazidesulfonic acid esters of (poly)ethylene glycol-di[(poly)hydroxybenzoates] such as ethylene glycol-di(3,5-dihydroxybenzoate)-1,2-naphthoquinonediazide-5-sulfonic acid ester, polyethylene glycol-di(3,4,5-trihydroxybenzoate)-1,2-naphthoquinonediazide-5 sulfonic acid ester and the like; 1,2-quinonediazidesulfonic acid esters of alpha-pyrone type natural coloring matters having hydroxy groups; 1,2-quinonediazidesulfonic acid esters of gamma-pyrone type natural coloring matters having hydroxyl groups; 1,2-quinonediazidesulfonic acid esters of diazine type natural coloring matters having hydroxyl groups; etc. In addition to these 1,2-quinonediazide compounds, there may be used the 1,2-quinonediazide compounds described in J. Kosar, "Light-Sensitive Systems" 339-352 (1965), John Wiley & Sons, New York and W.S. De Forest, "Photoresist" 50 (1975), McGraw-Hill, Inc., New York.

Of these 1,2-naphthoquinonediazide compounds, particularly preferred is 2,3,4,4'-tetrahydroxybenzophenone-1,2-naphthoquinonediazide-4-sulfonic acid ester because a resist having a good resolution, a good sensitivity, a good developability and an excellent thermal resistance is obtained.

These 1,2-quinonediazide compounds are used alone or in admixture of two or more.

The 1,2-quinonediazide compound is used in an amount of usually 5 to 100 parts by weight, preferably 10 to 50 parts by weight, per 100 parts by weight of the novolac. When the amount is less than 5 parts by weight, the patterning is difficult because the amount of the carboxylic acid produced by the 1,2-quinonediazide compound absorbing a radiation is small. When the amount of the 1,2-quinonediazide compound used exceeds 100 parts by weight, it is impossible to decompose the whole of the 1,2-quinonediazide compound added by the irradiation with a radiation for a short period of time, and thus, the development with a developing solution consisting of an aqueous alkaline solution becomes difficult.

The present resin composition may contain a sensitizer in order to increase the sensitivity as resist. The sensitizer includes, for example, 2H-pyrido[3,2-b]1,4-oxazin-3-[4H]-ones, 10H-pyrido[3,2-b][1,4]-benzothiazines, urazoles, hydantoins, barbituric acids, glycine anhydrides, 1-hydroxybenzotriazoles, alloxans, maleimides and further sensitizers described in Japanese Patent Publication Nos. 12,242/73 and 35,402/73, Japanese Patent Application Kokai (Laid-Open) Nos. 37,641/83 and 149,042/83 and the like. The amount of the sensitizer contained is usually not more than 100 parts by weight, preferably 4 to 60 parts by weight, per 100 parts by weight of the 1,2-quinonediazide compound.

Moreover, the present resin composition may contain a surface active agent for improving the coatability, for example, striation, and the developability of the radiation-irradiated portions after the formation of dry resist film. The surface active agent includes, for example, nonionic surfactants [e.g. polyoxyethylene alkyl ethers such as polyoxyethylene lauryl ether, polyoxyethylene stearyl ether, polyoxyethylene oleyl ether and the like; polyoxyethylene alkylphenyl ethers such as polyoxyethylene octylphenyl ether, polyoxyethylene nonylphenyl ether and the like; polyethylene glycol difatty acid esters such as polyethylene glycol dilaurate, polyethylene glycol distearate and the like]; fluorinecontaining surfactants such as F Top EF 301, EF 303 and EF 352 (these are products of Shin Akita Kasei K.K.), Megafac F 171 and F 173 (these are products of DAI-NIPPON INK & CHEMICALS), Fluorad FC 430 and FC 431 (these are products of Sumitomo 3M Limited), Asahi Guard AG 710 and Surflon S-382, SC 101, SC 102, SC 103, SC 104, SC 105 and SC 106 (these are products of Asahi Glass Co., Ltd.), and straight chain-like fluorine-containing surfactants having fluorinated alkyl groups or perfluoroalkyl groups as described in Japanese Patent Application Kokai (Laid Open) No. 178,242/82 and the like; organosiloxane polymer KP 341 (a product of Shin-Etsu Chemical Co., Ltd.); and acrylic or methacrylic (co)polymer Polyflow No. 75 and No. 95 (these are products of Kyoeisha Yushikagaku Kogyo K.K.).

The amount of the surface active agent contained is usually not more than 2 parts by weight, preferably not more than 1 part by weight, per 100 parts by weight in total of the novolac and the 1,2-quinonediazide compound.

Also, the present resin composition may contain a coloring agent for visualizing the latent image in the radiation-irradiated portions and for reducing the adverse effect of halation during irradiation with a radiation, and may also contain an adhering aid for improving the adhesiveness to substrate.

The coloring agent includes, for example, compounds such as 1-phenyl-4-phenylazo-5-oxypyrazole, 1-phenyl-4-(2,5-dichlorophenylazo)-5-oxypyrazole, 1-phenyl4-(4-methoxyphenylazo)-5-oxypyrazole, 3-ethyl-1-phenyl4-(4-methoxy-2-nitrophenylazo)-5-oxypyrazole and the like. Coloring agents on the market under the trade names of C.I. Solvent Yellow 16 and C.I. Solvent Yellow 21 (all of these are products of Mitsui Toatsu Chemicals, Inc.) can also be used appropriately. The amount of the coloring agent contained is usually not more than 6 parts by weight, preferably not more than 4 parts by weight, per 100 parts by weight in total of the novolac and the 1,2-quinonediazide compound.

The adhering aid includes, for example, silicon compounds such as 3-aminopropyltriethoxysilane, vinyltrichlorosilane, 2-(3,4-epoxycyclohexylethyl)trimethoxysilane and the like. The amount of the adhering aid contained is usually not more than 4 parts by weight, preferably not more than 2 parts by weight, per 100 parts by weight in total of the novolac and the 1,2-quinonediazide compound.

In addition, the present resin composition may contain, if necessary, a storage stabilizer, an antifoaming agent and the like.

In coating the present resin composition on a substrate such as a silicon wafer or the like, appropriate amounts of the novolac, the 1,2-quinonediazide compound and other optional components are dissolved in an appropriate solvent so that the total concentration becomes, for example, 5 to 50% by weight; the resulting solution is filtered through a filter having a pore diameter of, for example, about 0.2 μm to prepare a solution of the present resin composition; and the solution is coated on a substrate by spin-coating, flow-coating, roll coating or the like. The solvent used in this operation includes, for example, glycol ethers such as ethylene glycol monomethyl ether, ethylene glycol monoethyl ether and the like; cellosolve esters such as methyl cellosolve acetate, ethyl cellosolve acetate and the like; propylene glycol alkyl ether acetates such as propylene glycol methyl ether acetate, propylene glycol ethyl ether acetate and the like; monooxymonocarboxylic acid esters such as methyl 2-oxypropionate, ethyl 2-oxypropionate and the like; aromatic hydrocarbons such as toluene, xylene and the like; ketones such as methyl ethyl ketone, cyclohexanone and the like; and esters such as ethyl acetate, butyl acetate and the like. These solvents are used alone or in admixture of two or more. Moreover, a high boiling solvent may be added as necessary such as an ether, for example, benzyl ethyl ether, dihexyl ether or the like; a glycol ether, for example, diethylene glycol monomethyl ether, diethylene glycol monoethyl ether or the like; a ketone, for example, acetonylacetone, isophorone or the like; a fatty acid, for example, caproic acid, caprylic acid or the like; an alcohol, for example, 1-octanol, 1-nonanol, benzyl alcohol or the like; or an ester, for example, benzyl acetate, ethyl benzoate, diethyl oxalate, diethyl maleate, gamma-butyrolactone, ethylene carbonate, propylene carbonate, phenyl cellosolve acetate or the like.

In developing the present resin composition which has been irradiated with a radiation, there is used an aqueous alkaline solution prepared by dissolving in water an inorganic alkali such as sodium hydroxide, potassium hydroxide, sodium carbonate, sodium silicate, sodium metasilicate, ammonia water or the like; a primary amine such as ethylamine, n-propylamine or the like; a secondary amine such as diethylamine, di-n-propylamine or the like; a tertiary amine such as triethylamine, methyldiethylamine or the like; an alcoholamine such as dimethylethanolamine, triethanolamine or the like; a quaternary ammonium salt such as tetramethylammonium hydroxide, tetraethylammonium hydroxide, choline or the like; or a cyclic amine such as pyrrole, piperidine, 1,8-diazabicyclo[5,4,0]-7-undecene, 1,5-diazabicyclo[4,3,0]-5-nonane or the like. When preparing integrated circuits, it is preferred to use an aqueous alkaline solution of a quaternary ammonium salt or a cyclic amine.

The developing solution may further contain appropriate amounts of a water-soluble organic solvent, for example, an alcohol such as methanol, ethanol or the like, and a surface active agent.

Since the specific novolac is contained, the positive type radiation-sensitive resin composition of this invention is excellent in resolution, sensitivity, developability, adhesion and thermal resistance. The positive type radiation-sensitive resin composition of this invention is sensitive to radiations such as ultraviolet rays, far-ultraviolet rays, X-rays, electron beams, molecular beams, gamma-rays, synchrotron radiations, proton beams and the like and accordingly is suitable as a resist for producing highly integrated circuits.

This invention will be explained in more detail below by way of Examples. However, it should not be understood that the invention be restricted to the Examples.

EXAMPLE 1

Into a 5,000-ml separable flask equipped with a stirrer, a condenser and a thermometer were charged 324 g (3 moles) of m-cresol, 244 g (2 moles) of 3,5-dimethylphenol, 770 g of a 37% by weight aqueous formaldehyde solution and 0.8 g of oxalic acid. Then, the flask was immersed in an oil bath and a reaction was effected for 1 hour while maintaining the internal temperature at 100° C. Subsequently, 324 g (3 moles) of m cresol and 244 g (2 moles) of 3,5-dimethylphenol were continuously charged into the flask with the progress of the reaction, whereby the reaction was conducted for a further 2 hours.

Thereafter, the temperature of the oil bath was elevated to 180° C. and simultaneously the interior of the flask was made vacuum, whereby water, unreacted formaldehyde, unreacted m-cresol, unreacted 3,5-dimethylphenol and oxalic acid were removed. The resulting molten novolac was returned to room temperature and recovered.

The novolac recovered was dissolved in tetrahydrofuran and subjected to measurement of molecular weight distribution according to the GPC using a monodisperse polystyrene as the standard and employing GPC columns manufactured by TOYO SODA MFG. CO., LTD. (two G 2,000 H6 columns, one G 3,000 H6 column and one G 4,000 H6 column) under the conditions that the flow rate is 1.5 ml/min, the elution solvent is tetrahydrofuran and the column temperature is 40° C. The results are shown in Table 1.

100 Parts by weight of this novolac and 29 parts by weight of the 1,2-quinonediazide compound shown in Table 1 were dissolved in 301 parts by weight of ethyl cellosolve acetate to prepare a solution of a composition of this invention. This solution was filtered through a membrane filter having a pore diameter of 0.2 $\mu$m.

The filtered solution was spin-coated on a silicon wafer using a spinner according to a conventional method. The coated wafer was prebaked on a hot plate at 90° C. for 2 minutes to form a resist film of 1.2 $\mu$m in thickness on the wafer.

Then, the resist film was exposed to a light by means of a stepper (4800 DSW, manufactured by GCA CO.) having mounted thereon a test pattern reticle, while varying the exposure time and changing the place to be exposed so that the exposed places did not overlap, after which the film was developed with an aqueous solution containing 2.4% by weight of tetramethylammonium hydroxide at 25° C. for 60 seconds, water-rinsed and dried.

The resist pattern thus obtained was observed by means of a scanning type electron microscope in order to determine an exposure time that a line and space pattern having a line width of 1.2 $\mu$m or more was exactly formed on the resist pattern after development (this exposure time is hereinafter referred to as "an optimum exposure time"). This optimum exposure time was 0.4 second, that is, the resist film had a good sensitivity. No scum-like residue of development was seen on the resist pattern. Further, a smallest resist pattern dimension at the optimum exposure time (this dimension is hereinafter referred to as "resolution") was determined to be 0.8 $\mu$m which means a high resolution. The wafer having this resist pattern thereon was placed in an oven and a temperature at which the resist pattern began to show deformation was determined. As a result, the temperature was 150° C., which indicates that the resist had a good thermal resistance. The resist further showed good adhesion to the wafer, and no etchant was penetrated between resist and wafer.

These results are shown in Table 1.

EXAMPLES 2 to 5

Novolacs were produced in the same manner as in Example 1, except that the phenols shown in Table 1 were used. The novolacs were subjected to measurement of molecular weight distribution in the same manner as in Example 1. The results are shown in Table 1.

Then, solutions of the present compositions were prepared in the same manner as in Example 1, except that the above novolacs and the 1,2-quinonediazide compounds of the types and amounts shown in Table 1 were used. These solutions were filtered and then subjected to evaluation of resist performance in the same manner as in Example 1. The results are shown in Table 1. Each resist was excellent in sensitivity, resolution, developability, thermal resistance and adhesion.

COMPARATIVE EXAMPLE 1

Into the same separable flask as in Example 1 were charged at one time 648 g (6 moles) of m-cresol, 488 g (4 moles) of 3,5-dimethylphenol, 770 g of a 37% by weight aqueous formaldehyde solution and 8 g of oxalic acid together. The flask was immersed in an oil bath and reaction was effected for 2 hours while maintaining the internal temperature at 100° C. The subsequent procedure was conducted in the same manner as in Example 1 to obtain a novolac. The novolac was subjected to measurement of molecular weight distribution in the same manner as in Example 1. The results are shown in Table 1.

Then, a composition solution was prepared in the same manner as in Example 1, except that the above novolac and the 1,2-quinonediazide compound of the type and amount shown in Table 1 were used. The solution was filtered and subjected to evaluation of resist performance in the same manner as in Example 1.

shown in Table 1 were used. The novolacs were subjected to measurement of molecular weight distribution in the same manner as in Example 1. The results are shown in Table 1.

Then, composition solutions were prepared in the same manner as in Example 1, except that the above novolacs and the 1,2-quinonediazide compounds of the types and amounts shown in Table 1 were used. The solutions were filtered and subjected to evaluation of resist performance in the same manner as in Example 1. The results are shown in Table 1. The resists were inferior to those of the above Examples in sensitivity, resolution, developability and adhesion.

TABLE 1

| | | Novolac | | | | | | | |
|---|---|---|---|---|---|---|---|---|---|
| | Proportions of phenol mixture charged (by mole) | Polystyrene-reduced molecular weight ranges | | | | | | | |
| | | 6,300 to 25,000 | | 2,500 to 6,000 | | 150 to 900 | | | |
| | | Molecular weight at max. peak | Max. peak height (a) | Molecular weight at max. peak | Max. peak height (b) | Molecular weight at max. peak | Max. peak height (c) | a/b | c/b |
| Example 1 | m-Cresol/3,5-dimethylphenol = 60/40 | 13,200 ± 1,000 | 8.45 | 3,160 ± 300 | 8.20 | 316 ± 50 | 8.37 | 1.03 | 1.02 |
| Example 2 | m-Cresol/3,5-dimethylphenol = 50/50 | 12,700 ± 1,000 | 7.19 | 3,220 ± 300 | 8.27 | 316 ± 50 | 8.35 | 0.87 | 1.01 |
| Example 3 | m-Cresol/2,3,5-trimethylphenol = 60/40 | 12,000 ± 1,000 | 7.56 | 3,300 ± 300 | 8.40 | 330 ± 60 | 7.98 | 0.90 | 0.95 |
| Example 4 | m-Cresol/4-t-butylphenol = 80/20 | 10,000 ± 1,000 | 8.28 | 3,200 ± 300 | 8.45 | 350 ± 60 | 8.03 | 0.98 | 0.95 |
| Example 5 | m-Cresol/3,5-dimethylphenol = 60/40 | 13,200 ± 1,000 | 8.45 | 3,160 ± 300 | 8.20 | 316 ± 50 | 8.37 | 1.03 | 1.02 |
| Comparative Example 1 | m-Cresol/3,5-dimethylphenol = 60/40 | 16,000 ± 1,500 | 8.20 | 3,100 ± 300 | 6.56 | 316 ± 50 | 2.30 | 1.25 | 0.35 |
| Comparative Example 2 | m-Cresol/ethyl gallate = 80/20 | 22,000 ± 3,000 | 6.21 | 4,500 ± 600 | 3.88 | 340 ± 60 | 8.15 | 1.60 | 2.10 |
| Comparative Example 3 | m-Cresol/4-t-butylcatechol = 5/95 | 22,000 ± 3,000 | 8.20 | 3,400 ± 300 | 5.13 | 350 ± 60 | 1.54 | 1.60 | 0.30 |

| | Novolac | 1,2-Quinone-diazide compound | | Ethyl cellosolve acetate | Evaluation results | | | | |
|---|---|---|---|---|---|---|---|---|---|
| | Amount added (weight parts) | Type*1 | Amount added (weight parts) | Amount added (weight parts) | Sensitivity (optimum exposure time) (sec) | Resolution (μm) | Developability | Thermal resistance (°C.) | Adhesion |
| Example 1 | 100 | I | 29 | 301 | 0.40 | 0.8 | Good | 150 | Good |
| Example 2 | 100 | I | 26 | 280 | 0.43 | 0.8 | Good | 145 | Good |
| Example 3 | 100 | I | 29 | 316 | 0.43 | 0.8 | Good | 150 | Good |
| Example 4 | 100 | II | 26 | 294 | 0.40 | 0.8 | Good | 145 | Good |
| Example 5 | 100 | II | 26 | 295 | 0.38 | 0.8 | Good | 155 | Good |
| Comparative Example 1 | 100 | I | 29 | 332 | 0.60 | 1.2 | Scum-like residue of development | — | Poor |
| Comparative Example 2 | 100 | I | 28 | 300 | 0.75 | 1.6 | Scum-like residue of development | — | — |
| Comparative Example 3 | 100 | I | 28 | 303 | 0.86 | 1.2 | Scum-like residue of development | — | Poor |

Note:
*1Type of 1,2-quinonediazide compound
I: Condensation product of 2.5 moles of 1,2-naphthoquinonediazide-5-sulfonic acid chloride and 1 mole of 2,3,4-trihydroxybenzophenone
II: Condensation product of 2.5 moles of 1,2-naphthoquinonediazide-5-sulfonic acid chloride and 1 mole of 2,3,4,4'-tetrahydroxybenzophenone The results are shown in Table 1. The resist was inferior to those of the above Examples in sensitivity, resolution, developability and adhesion.

COMPARATIVE EXAMPLES 2 and 3

Novolacs were produced in the same manner as in Comparative Example 1, except that the phenol mixture

EXAMPLE 6

Into the same separable flask as in Example 1 were charged 162 g (1.5 moles) of m-cresol, 468 g (6 moles) of p-cresol, 770 g of a 37% by weight aqueous formaldehyde solution and 0.45 g of oxalic acid. The separable flask was immersed in an oil bath and reaction was effected for 1 hour while maintaining the internal temperature at 100° C. With the progress of the reaction, 270 g (2.5 moles) of m cresol was further continuously charged and the reaction was effected for 2 hours.

Then, the temperature of the oil bath was elevated to 170° C. and simultaneously the interior of the flask was made vacuum, whereby water, unreacted m-cresol, unreacted p cresol, unreacted formaldehyde and oxalic acid were removed. The resulting molten novolac was cooled to room temperature recovered and subjected to measurement of molecular weight distribution. The results are shown in Table 2.

Thereafter, 100 parts by weight of the above novolac and the 1,2-quinonediazide compound of the type and amount shown in Table 2 were dissolved in 340 parts by weight of ethyl cellosolve acetate to prepare a composition solution. In the same manner as in Example 1, this solution was filtered and subjected to evaluation of resist performance. The results are shown in Table 2. The resist was excellent in sensitivity, resolution, developability, thermal resistance and adhesion.

EXAMPLES 7 to 13

Novolacs were produced in the same manner as in Example 6, except that the phenol mixture shown in Table 2 were used. The novolacs were subjected to measurement of molecular weight distribution in the same manner as in Example 1. The results are shown in Table 2.

Then, solutions of the present compositions were prepared in the same manner as in Example 1, except that the above novolacs and the 1,2-quinonediazide compounds of the types and amounts shown in Table 2 were used. The solutions were filtered and subjected to evaluation of resist performance in the same manner as in Example 1. The results are shown in Table 2. Each resist was excellent in sensitivity, resolution, developability, thermal resistance and adhesion.

COMPARATIVE EXAMPLE 4

Into the same separable flask as in Example 1 were charged 108 g (1 mole) of m-cresol, 864 g (8 moles) of p-cresol, 770 g of a 37% by weight aqueous formaldehyde solution and 0.45 g of oxalic acid. The flask was immersed in an oil bath and reaction was effected for 1 hour while maintaining the interior temperature at 100° C. With the progress of the reaction, 108 g (1 mole) of m-cresol was further continuously charged and the reaction was effected for 2 hours. The subsequent procedure was conducted in the same manner as in Example 6 to obtain a novolac. This novolac was subjected to measurement of molecular weight distribution in the same manner as in Example 1. The results are shown in Table 2.

Then, a composition solution was prepared in the same manner as in Example 1, except that the above novolac, the 1,2-quinonediazide compound of the type and amount shown in Table 2 were used. In the same manner as in Example 1, the solution was filtered and subjected to evaluation of resist performance. The results are shown in Table 2. The resist was inferior to those of the above Examples in sensitivity, developability, resolution and adhesion.

COMPARATIVE EXAMPLE 5

Into the same separable flask as in Example 1 were charged at one time 432 g (4 moles) of m-cresol, 648 g (6 moles) of p-cresol, 770 g of a 37% by weight aqueous formaldehyde solution and 0.45 g of oxalic acid together. The flask was immersed in an oil bath and reaction was effected for 3 hours while maintaining the interior temperature at 100° C. The subsequent procedure was conducted in the same manner as in Example 6 to obtain a novolac. The novolac was subjected to measurement of molecular weight distribution in the same manner as in Example 1. The results are shown in Table 2.

A composition solution was prepared in the same manner as in Example 1, except that the above novolac and the 1,2-quinonediazide compound of the type and amount shown in Table 2 were used. In the same manner as in Example 1, the solution was filtered and subjected to evaluation of resist performance. The results are shown in Table 2. The resist was inferior to those of the above Examples in sensitivity, resolution, developability and adhesion.

COMPARATIVE EXAMPLE 6

Into the same separable flask as in Example 1 were charged 648 g (6 moles) of m-cresol, 432 g (4 moles) of p-cresol, 770 g of a 37% by weight aqueous formaldehyde solution and 9 g of oxalic acid. The flask was immersed in an oil bath and reaction was effected for 1 hour while maintaining the internal temperature at 100° C. The subsequent procedure was conducted in the same manner as in Example 6 to obtain a novolac. The novolac was subjected to measurement of molecular weight distribution in the same manner as in Example 1. The results are shown in Table 2.

Then a composition solution was prepared in the same manner as in Example 1, except that the above novolac and the 1,2-quinonediazide compound of the type and amount shown in Table 2 were used. In the same manner as in Example 1, the solution was filtered and subjected to evaluation of resist performance. The results are shown in Table 2. The resist was inferior to those of the above Examples in sensitivity, resolution, developability and adhesion.

TABLE 2

| | | Novolac | | | | | | | |
|---|---|---|---|---|---|---|---|---|---|
| | Proportions | Polystyrene-reduced molecular weight ranges | | | | | | | |
| | of phenol | 6,300 to 25,000 | | 2,500 to 6,000 | | 150 to 900 | | | |
| | mixture charged (by mole) | Molecular weight at max. peak | Max. peak height (a) | Molecular weight at max. peak | Max. peak height (b) | Molecular weight at max. peak | Max. peak height (c) | a/b | c/b |
| Example 6 | m-Cresol/ p-cresol = 40/60 | 13,200 ± 1,100 | 8.28 | 3,410 ± 300 | 6.52 | 288 ± 50 | 5.41 | 1.27 | 0.83 |
| Example 7 | m-Cresol/ p-cresol = | 11,000 ± 1,000 | 5.60 | 3,320 ± 300 | 6.75 | 288 ± 50 | 8.30 | 0.83 | 1.23 |

TABLE 2-continued

| | | | | | | | | | |
|---|---|---|---|---|---|---|---|---|---|
| Example 8 | m-Cresol/<br>p-cresol =<br>50/50 | 14,400 ± 1,100 | 8.24 | 3,300 ± 300 | 6.34 | 288 ± 50 | 5.07 | 1.30 | 0.80 |
| Example 9 | m-Cresol/<br>p-cresol =<br>50/50 | 12,000 ± 1,100 | 7.20 | 3,400 ± 300 | 7.66 | 288 ± 50 | 8.43 | 0.94 | 1.10 |
| Example 10 | m-Cresol/<br>p-cresol =<br>60/40 | 12,800 ± 1,100 | 8.32 | 3,520 ± 300 | 7.23 | 288 ± 50 | 6.73 | 1.15 | 0.93 |
| Example 11 | m-Cresol/<br>p-cresol =<br>40/60 | 13,200 ± 1,100 | 8.32 | 3,400 ± 300 | 6.55 | 288 ± 50 | 5.44 | 1.27 | 0.83 |
| Example 12 | m-Cresol/<br>p-cresol =<br>40/60 | 13,200 ± 1,100 | 8.28 | 3,400 ± 300 | 6.52 | 288 ± 50 | 5.41 | 1.27 | 0.83 |
| Example 13 | m-Cresol/<br>p-cresol =<br>40/60 | 13,200 ± 1,100 | 8.36 | 3,400 ± 300 | 6.58 | 288 ± 50 | 5.46 | 1.27 | 0.83 |
| Comparative Example 4 | m-Cresol/<br>p-cresol =<br>20/80 | 12,500 ± 1,100 | 6.99 | 3,420 ± 300 | 6.35 | 288 ± 50 | 8.45 | 1.10 | 1.33 |
| Comparative Example 5 | m-Cresol/<br>p-cresol =<br>40/60 | 22,000 ± 3,000 | 8.26 | 4,500 ± 300 | 5.16 | 288 ± 50 | 3.25 | 1.60 | 0.63 |
| Comparative Example 6 | m-Cresol/<br>p-cresol =<br>60/40 | 14,400 ± 1,100 | 8.24 | 3,300 ± 300 | 6.34 | 288 ± 50 | 1.90 | 1.30 | 0.30 |

| | Novolac Amount added (weight parts) | 1,2-Quinone-diazide compound | | Ethyl cellosolve acetate Amount added (weight parts) | Evaluation results | | | | |
|---|---|---|---|---|---|---|---|---|---|
| | | Type*[1] | Amount added (weight parts) | | Sensitivity (optimum exposure time) (sec) | Resolution (μm) | Developability | Thermal resistance (°C.) | Adhesion |
| Example 6 | 100 | I | 25 | 340 | 0.40 | 0.8 | Good | 150 | Good |
| Example 7 | 100 | I | 30 | 350 | 0.30 | 0.8 | Good | 150 | Good |
| Example 8 | 100 | I | 28 | 350 | 0.45 | 0.8 | Good | 150 | Good |
| Example 9 | 100 | II | 25 | 340 | 0.35 | 0.8 | Good | 150 | Good |
| Example 10 | 100 | II | 28 | 350 | 0.40 | 0.8 | Good | 150 | Good |
| Example 11 | 100 | III | 27.5 | 350 | 0.39 | 0.8 | Good | 150 | Good |
| Example 12 | 100 | IV | 27.5 | 350 | 0.42 | 0.8 | Good | 150 | Good |
| Example 13 | 100 | V | 22 | 320 | 0.24 | 0.8 | Good | 150 | Good |
| Comparative Example 4 | 100 | I | 28 | 350 | 0.95 | 1.2 | Scum-like residue of development | — | — |
| Comparative Example 5 | 100 | I | 25 | 340 | 0.90 | 1.2 | Scum-like residue of development | — | Poor |
| Comparative Example 6 | 100 | I | 30 | 350 | 0.95 | 1.2 | Scum-like residue of development | — | Poor |

Note:
*[1]Type of 1,2-quinonediazide compound
I: Condensation product of 1 mole of 2,3,4-trihydroxybenzophenone and 2.5 moles of 1,2-naphthoquinonediazide-5-sulfonic acid chloride
II: Condensation product of 1 mole of 2,3,4,4'-tetrahydroxybenzophenone and 3 moles of 1,2-naphthoquinonediazide-5-sulfonic acid chloride
III: Condensation product of 1 mole of 2,2',5,6'-tetrahydroxybenzophenone and 3 moles of 1,2-naphthoquinonediazide-5-sulfonic acid chloride
IV: Condensation product of 1 mole of 2',3,4,5,6'-pentahydroxybenzophenone and 3 moles of 1,2-naphthoquinonediazide-5-sulfonic acid chloride
V: Condensation product of 1 mole of 2',3,3',4,4',5-hexahydroxybenzophenone and 4.5 moles of 1,2-naphthoquinonediazide-5-sulfonic acid chloride

EXAMPLE 14

A resist film was formed according to the same procedure as in Example 6.

The resist was subjected to evaluation of resist performance in the same manner as in Example 1, except that FPA-1550 manufactured by CANON INC. having mounted thereon a test pattern reticle was used as a stepper. The resist had a high sensitivity (optimum exposure time: 0.3 second). No scum-like residue was seen after development. Further, the resist had a very high resolution of 0.7 μm.

EXAMPLE 15

A resist film was formed according to the same procedure as in Example 6.

The resist was subjected to evaluation of resist performance in the same manner as in Example 1, except that FPA-1550 manufactured by CANON INC. having mounted thereon a test pattern reticle was used as a stepper and the development was effected with a 2.2% by weight aqueous tetramethylammonium hydroxide solution. The resist had a high sensitivity (optimum exposure time: 0.6 second). No scum-like residue was seen after development. Further, the resist had a very high resolution of 0.6 μm.

REFERENCE EXAMPLE

Into a 500-ml separable flask equipped with a stirrer, a dropping funnel and a thermometer were charged, while shielding light, 10.5 g of 2,3,4,4'-tetrahydroxybenzophenone and 34.5 g of 1,2-naphthoquinonediazide-5-sulfonic acid chloride (the molar ratio of the latter/the former was 3). Thereto was further added 240 g of dioxane. The mixture was formed into a solution by stirring. Separately, 14.3 g of triethylamine was charged into the dropping funnel. The separable flask was immersed in a water bath maintained at 30° C., and when the internal temperature reached 30° C., triethylamine was added so gradually that the internal temperature did not exceed 35° C. The triethylamine hydrochloride precipitated was removed by filtration. The filtrate was poured into a large amount of dilute hydrochloric acid to precipitate a 1,2-quinonediazide compound. The compound was recovered by filtration and then dried for 24 hours at 40° C. The yield of the compound as dried was 98%.

The 1,2-quinonediazide compound thus obtained was subjected to composition analysis to find that the proportion of tetraester was 63% by weight, the total proportion of triester and diester was 32% by weight, and the proportion of monoester was 5% by weight.

The composition distributions of the 1,2-quinonediazide compounds obtained above or used in the following Examples were measured by a gel permeation chromatography (GPC). The measurement conditions for the GPC were as follows:

Separating column: A column of 20 mm in inside diameter and 60 cm in length, packed with a polystyrene gel having an average pore diameter of 7 Å.
Eluent: Tetrahydrofuran
Flow rate: 2 ml/min
Detector: A differential refractometer, SHODEX SE 31, manufactured by Showa Denko K.K.
Separating column temp.: 25° C.

Amount of sample charged: 100 μl of about 1.0% by weight solution in tetrahydrofuran.

EXAMPLE 16

100 Parts by weight of the novolac obtained in Example 1, 26 parts by weight of the 2,3,4,4'-tetrahydroxybenzophenone-1,2-naphthoquinonediazide-5-sulfonic acid ester obtained in the Reference Example and 300 parts by weight of ethyl cellosolve acetate were sufficiently stirred at room temperature to obtain a solution. This solution was filtered through a membrane filter having a pore diameter of 0.2 μm to prepare a solution of a composition of this invention.

The solution was coated on a silicon wafer having a silicon oxide film, using a spinner and prebaked at 90° C. for 2 minutes to form a resist layer of 1.2 μm in thickness. Then, light exposure and development were conducted in the same manner as in Example 1 to obtain a resist pattern. Upon observation of the pattern through a scanning type electron microscope, no scum-like residue of development was seen and the pattern had a resolution of 0.8 μm. The wafer having this resist pattern thereon was placed in an oven to determine a temperature at which the pattern began to show deformation to be 160° C., which indicates that the resist has a good thermal resistance. Further, the resist had a good adhesion to the wafer and no etchant penetration between resist and wafer was seen. The results are shown in Table 3.

EXAMPLES 17 and 18

1,2-Quinonediazide compounds were produced in the same manner as in the Reference Example, except that the raw materials of the types and amounts shown in Table 3 were used. The results of composition analysis by GPC of these 1,2-quinonediazide compounds are shown in Table 3.

In the same manner as in Example 16, except that the above 1,2-quinonediazide compounds and the novolacs shown in Table 3 were used in the proportions shown in Table 3, solutions of compositions of this invention were prepared, filtered and subjected to evaluation of resist performance. The results are shown in Table 3. Each resist was excellent in sensitivity, resolution, developability, thermal resistance and adhesion.

TABLE 3

| | Novolacs | | 1,2-Quinonediazide compound | | | | | | | |
|---|---|---|---|---|---|---|---|---|---|---|
| | | Amount added (weight parts) | Composition of feed (g) | | | | NQD/THBP (mole ratio) | Analysis by GPC (wt. %) | | | Amount added (weight parts) |
| | Type*1 | | THBP*2 | NQD*3 | Triethyl-amine | Dioxane | | Mono-ester | Sum of diester and triester | Tetra-ester | |
| Example 16 | I | 100 | 10.5 | 34.5 | 14.3 | 240 | 3.0 | 5 | 32 | 63 | 26 |
| Example 17 | I | 100 | 10.5 | 22.9 | 9.5 | 240 | 2.0 | 15 | 45 | 40 | 26 |
| Example 18 | II | 100 | 10.5 | 28.7 | 11.9 | 240 | 2.5 | 10 | 40 | 50 | 26 |

| | Ethyl cellosolve acetate Amount added (weight parts) | Evaluation | | | | |
|---|---|---|---|---|---|---|
| | | Sensitivity (optimum exposure time) (sec) | Resolution (μm) | Developability | Thermal resistance (°C.) | Adhesion |
| Example 16 | 300 | 0.50 | 0.8 | Good | 160 | Good |
| Example 17 | 300 | 0.30 | 0.8 | Good | 150 | Good |
| Example 18 | 300 | 0.35 | 0.8 | Good | 150 | Good |

Note:
*1Type of novolac
I: Novolac obtained in Example 1.
II: Novolac obtained in Example 6.
*2THBP: 2,3,4,4'-Tetrahydroxybenzophenone
*3NQD: 1,2-Naphthoquinonediazide-5-sulfonic acid chloride

What is claimed is:

1. A positive type radiation-sensitive composition comprising:
   (a) an alkali-soluble novolac resin produced by condensing a carbonyl compound and a phenol mixture consisting essentially of 30-90 mole % of m-cresol and 70-10 mole % of at least one compound represented by the formula (I) other than m-cresol;

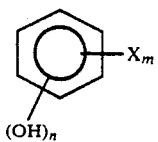

wherein X is —CH₃, —C₂H₅, —C(CH₃)₃; n is 1; and m is an integer satisfying 3≧m≧1, in which resin when the polystyrenereduced molecular weight is determined by a gel permeation chromatography using a monodisperse polystyrene as the standard, maximum values a, b and c present, respectively, in the molecular weight ranges of 6,300 to 25,000, 2,500 to 6,000 and 150 to 900 in the molecular weight distribution curve obtained satisfy the following relationships:

$a/b = 0.2-1.3$ $c/b = 0.5-1.5$ and (b) a 1,2-quinonediazide compound comprising at least one 1,2-quinonediazidesulfonic acid ester of (poly)hydroxyphenyl aryl ketone selected from the group consisting of tetrahydroxybenzophenone, pentahydroxybenzophenone and hexahydroxybenzophenone in an amount sufficient to form a resist image upon irradiation and subsequent development.

2. The positive type radiation-sensitive resin composition according to claim 1, wherein the phenyl aryl ketone is tetrahydroxybenzophenone.

3. The positive type radiation-sensitive resin composition according to claim 1, wherein the at least one compound of formula (I) is selected from the group consisting of o-cresol, p-cresol, 3,5-dimethylphenol, 2,5-dimethylphenol, 2,3-dimethylphenol, 2,4-dimethylphenol, 2,6-dimethylphenol, 3,4-dimethylphenol, 2,3,5-trimethylphenol, 4-t-butylphenol, 2-t-butylphenol, 3-t-butylphenol, 3-ethylphenol, 2-ethylphenol, 4-ethylphenol, 2,3,5-triethylphenol, 3,5-diethylphenol, 2,5-diethylphenol and 2,3-diethylphenol.

4. The positive type radiation-sensitive resin composition according to claim 1, wherein the at least one compound of the formula (I) is selected from the group consisting of p-cresol, 3,5-dimethylphenol and 2,3,5-trimethylphenol.

5. The positive type radiation-sensitive resin composition according to claim 1, wherein the at least one compound of the formula (I) is selected from the group consisting of 3,5-dimethylphenol and 2,3,5-trimethylphenol.

6. The positive type radiation-sensitive resin composition according to claim 1, wherein the phenol mixture consists of 40 to 80 mole % of m-cresol and 60 to 20 mole % of the compound of the formula (I).

7. The positive type radiation-sensitive resin composition according to claim 1, wherein the phenol mixture consists of 40 to 60 mole % of m-cresol and 60 to 40 mole % of the compound of the formula (I).

8. The positive type radiation-sensitive resin composition according to claim 1, wherein the carbonyl compound is represented by the formula (II):

wherein R¹ and R², which may be the same or different, represent hydrogen atoms, alkyl groups, aryl groups, alkenyl groups or aralkyl groups.

9. The composition according to claim 1, wherein the carbonyl compound is at least one compound selected from the group consisting of formaldehyde, acetaldehyde, benzaldehyde, p-hydroxybenzaldehyde, acrolein, acetone, methyl ethyl ketone, diethyl ketone, methyl isobutyl ketone, methyl phenyl ketone and methyl benzyl ketone.

10. The positive type radiation-sensitive resin composition according to claim 1, wherein the amount of the carbonyl compound used is 0.7 to 3 moles per mole of the phenol mixture.

11. The positive type radiation-sensitive resin composition according to claim 1, wherein the 1,2-quinonediazidesulfonic acid ester of (poly)hyroxyphenyl aryl ketone is contained in an amount of 5 to 100 parts by weight per 100 parts by weight of the alkali-soluble novolac resin.

12. The positive type radiation-sensitive resin composition according to claim 1, wherein a/b=0.4−1.3 and c/b=0.5−1.3.

* * * * *